United States Patent
Domoto et al.

(10) Patent No.: US 6,770,175 B2
(45) Date of Patent: Aug. 3, 2004

(54) APPARATUS FOR AND METHOD OF FORMING ELECTRODE FOR LITHIUM SECONDARY CELL

(75) Inventors: Yoichi Domoto, Ikoma (JP); Hisaki Tarui, Kobe (JP); Hiromasa Yagi, Nishinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/122,315

(22) Filed: Apr. 16, 2002

(65) Prior Publication Data

US 2002/0175069 A1 Nov. 28, 2002

(30) Foreign Application Priority Data

Apr. 16, 2001 (JP) ........................................ 2001-116731

(51) Int. Cl.$^7$ .............................................. C23C 14/34
(52) U.S. Cl. ............................ 204/192.15; 204/298.06; 204/298.24; 204/298.26; 204/192.12
(58) Field of Search ....................... 204/298.06, 298.08, 204/298.11, 298.13, 298.23, 298.24, 298.26, 298.18, 192.12, 192.15, 192.2, 192.23

(56) References Cited

U.S. PATENT DOCUMENTS 5,108,571 A * 4/1992 Ludwig et al. ........ 204/192.13
6,051,340 A * 4/2000 Kawakami et al. ..... 429/231.95
6,319,371 B2 * 11/2001 Ishikawa et al. ....... 204/298.03
6,328,857 B1 * 12/2001 Anzaki et al. ......... 204/192.12

OTHER PUBLICATIONS

"Solid State Ionics, 113–115, pp57–67 (1998). Lithium Alloy Negative Electrodes Formed from Convertible Oxides" Robert A. Huggins.

* cited by examiner

Primary Examiner—Steven VerSteeg
(74) Attorney, Agent, or Firm—McDermott, Will & Emery

(57) ABSTRACT

An apparatus, for forming an electrode for a lithium secondary cell capable of readily forming an active material layer constituted by at least two elements and controlling the composition of the active material layer, comprises a first sputtering source for sputtering a first material forming the active material layer onto the surface of the collector and a second sputtering source for sputtering a second material forming the active material layer onto the surface of the collector. Plasma regions of the first and second sputtering sources are arranged to overlap each other. The active material layer constituted by at least two elements is readily formed with excellent reproducibility, and its composition can be readily controlled by independently controlling power applied to the first sputtering source and the second sputtering source.

23 Claims, 3 Drawing Sheets

APPARATUS FOR AND METHOD OF FORMING ELECTRODE FOR LITHIUM SECONDARY CELL

BACKGROUND OF THE INVENTION

1. Field of the Invention

The present invention relates to an apparatus for and a method of forming an electrode for a lithium secondary cell, and more specifically, it relates to an apparatus for and a method of forming an electrode for a lithium secondary cell for forming an active material layer on the surface of a collector.

2. Description of the Prior Art

In a lithium secondary cell actively subjected to research and development in recent years, the cell characteristics such as a charge/discharge voltage, an operating cycle lifetime and shelf stability remarkably depend on an electrode employed therein. Therefore, an active material employed for the electrode is improved for upgrading and improving the cell characteristics.

For example, a lithium secondary cell employing aluminum, Si or tin electrochemically alloyed with lithium in charging as a negative electrode active material is proposed in general, as reported in Solid State Ionics, 113–115, p 57 (1998) or the like. Among aluminum, Si and tin, Si having large theoretical capacity is particularly promising as a negative electrode active material for a cell exhibiting high capacity. Therefore, various lithium secondary cells having negative electrode active materials of Si are proposed.

In order to form the aforementioned negative electrode active material consisting of Si, Si is generally deposited on a collector from a sputtering source containing a target consisting of Si, thereby forming a negative electrode active material layer of Si on the collector.

In the aforementioned negative electrode active material layer consisting of only Si formed on the collector, however, the volume of Si alloyed with lithium thereby storing lithium is remarkably expanded and shrinked following charge/discharge reaction. In charging/discharging, therefore, Si is so powdered (pulverized) that the negative electrode active material layer consisting of Si is disadvantageously separated from the collector to deteriorate the operating cycle characteristics.

In general, therefore, a technique of preventing pulverization of Si by adding a foreign element to Si is developed. Pulverization of a thin film of Si can conceivably be suppressed by introducing the foreign element into the Si thin film and changing the mechanical/physical properties of the thin film. Therefore, it is important that the thin film homogeneously contains the foreign element. In the aforementioned conventional sputtering, however, it is difficult to form such a negative electrode active material layer containing Si and the foreign element added thereto on the collector. In other words, it is difficult to form the negative electrode active material containing Si and the foreign element added thereto in the conventional sputtering employing only a single target (single sputtering source) consisting of Si.

SUMMARY OF THE INVENTION

An object of the present invention is to provide an apparatus for forming an electrode for a lithium secondary cell capable of readily forming an active material layer constituted by at least two elements and controlling the composition of the active material layer.

Another object of the present invention is to form the active material layer constituted by at least two elements to have homogeneous concentration distribution in the aforementioned apparatus for forming an electrode for a lithium secondary cell.

Still another object of the present invention is to provide a method of forming an electrode for a lithium secondary cell capable of readily forming an active material layer constituted by at least two elements and controlling the composition of the active material layer.

A further object of the present invention is to form the active material layer constituted by at least two elements to have homogeneous concentration distribution in the aforementioned method of forming an electrode for a lithium secondary cell.

In order to attain the aforementioned objects, an apparatus for forming an electrode for a lithium secondary cell according to a first aspect of the present invention, employed for forming an active material layer on the surface of a collector, comprises a first sputtering source for sputtering a first material forming the active material layer onto the surface of the collector and a second sputtering source for sputtering a second material forming the active material layer onto the surface of the collector. A plasma region of the first sputtering source and a plasma region of the second sputtering source are arranged to overlap with each other.

The apparatus for forming an electrode for a lithium secondary cell according to the first aspect is provided with the first sputtering source and the second sputtering source for sputtering the first material and the second material forming the active material layer respectively onto the surface of the collector while arranging the plasma region of the first sputtering source and the plasma region of the second sputter region to overlap with each other as hereinabove described, whereby an active material layer constituted by at least two elements can be readily formed with excellent reproducibility. When power applied to the first sputtering source and that applied to the second sputtering source are controlled independently of each other in this case, the composition of the active material layer constituted by at least two elements can be readily controlled.

In this case, a resulting thin film preferably forms a solid solution of the first material (e.g., Si) and the second material (e.g., Co). In the above example, Co is preferably contained in Si not as an intermetallic compound of Si and Co but in the form of a solid solution. The term "intermetallic compound" stands for a compound formed by combining metals at a specific ratio to have a specific crystal structure. The solid solution is preferably in a non-equilibrium state. Only Ge is known as an element forming a solid solution with Si in an equilibrium state, and the solid solution of Si and a foreign element according to the aforementioned aspect exists only in a non-equilibrium state. In this point of view, formed Si is preferably in an amorphous or microcrystalline state, and sputtering which is a thermally non-equilibrium process, CVD, vacuum deposition or the like is preferably employed for forming Si.

The aforementioned apparatus for forming an electrode for a lithium secondary cell according to the first aspect preferably further comprises a collector holding part capable of holding the collector and relatively moving the collector with respect to the first sputtering source and the second sputtering source. The collector holding part capable of relatively moving the collector with respect to the first sputtering source and the second sputtering source is so provided that the composition ratio (concentration distribution) of the active material layer can be homogenized by moving the collector holding part when forming the active material layer constituted by at least two elements on the surface of the collector. Thus, the active material layer constituted by at least two elements can be readily formed with excellent reproducibility and homogeneous composition.

In this case, the collector holding part preferably includes means cooling the collector. According to this structure, the collector can be cooled when the active material layer constituted by at least two elements is formed thereon. Thus, the collector component can be prevented from excessively diffusing into the active material layer when the collector is at a high temperature. Further, strain (internal stress) resulting from difference in thermal expansion can also be prevented. Consequently, it is possible to prevent deterioration of charge/discharge characteristics resulting from excessive diffusion of the collector component in the active material layer or internal stress of the temperature leading to separation of the active material layer.

In the aforementioned structure comprising the collector holding part, the collector holding part preferably has a substantially cylindrical form, and the first sputtering source and the second sputtering source are preferably arranged to enclose the collector holding part. When the collector holding part is formed to have a substantially cylindrical form while arranging the first and second sputtering sources to enclose the collector holding part, the active material layer constituted by at least two elements can be readily formed on the collector with excellent reproducibility.

The aforementioned apparatus for forming an electrode for a lithium secondary cell according to the first aspect preferably further comprises an anti-adhesion member set on a region other than the area where the plasma region of the first sputtering source and the plasma region of the second sputter region overlap with each other. According to this structure, the active material layer can be formed on the collector only on the area where the plasma regions of the first and second sputtering sources overlap with each other.

In the aforementioned apparatus for forming an electrode for a lithium secondary cell according to the first aspect, the first sputtering source preferably includes a first target consisting of the first material, and the first material forming the first target preferably contains at least Si. When the first target of the first sputtering source contains at least Si and a target consisting of a foreign element is employed as the second sputtering source, the active material layer can be readily formed by adding the foreign element to Si. In this case, the first material forming the first target preferably contains at least one element selected from a group consisting of Cu, Co, Fe, Zn, Zr, Mn, Ni and Ag in addition to Si. When the first target of the first sputtering source is prepared from the material containing Si and the foreign element and a target consisting of the same foreign element as the above is employed as the second sputtering source, the composition ratio of Si and the foreign element can be more readily controlled when forming the active material layer by adding the foreign element to Si.

In the aforementioned apparatus for forming an electrode for a lithium secondary cell, the second sputtering source preferably includes a second target consisting of the second material, and the second material forming the second target preferably contains a metallic element. When the second material of the second sputtering source contains a metallic element and the target containing Si is employed as the first sputtering source, the active material layer can be readily formed by adding the metallic element to Si. In this case, the metallic element preferably includes at least one element selected from a group consisting of Cu, Co, Fe, Zn, Zr, Mn, Ni and Ag. When such a metallic element is employed as the component of the second target of the second sputtering source and Si is employed as the first sputtering source, the active material layer can be readily formed by adding the aforementioned metallic element to Si. In this case, pulverization of Si can be readily prevented by adding the aforementioned metallic element to Si.

In the aforementioned apparatus for forming an electrode for a lithium secondary cell according to the first aspect, the first sputtering source preferably includes a first target consisting of the first material, the first material forming the first target is preferably Si, the second sputtering source preferably includes a second target consisting of the second material, and the second material forming the second target is preferably Co. According to this structure, the active material layer consisting of Si and Co can be readily formed.

In the aforementioned apparatus for forming an electrode for a lithium secondary cell according to the first aspect, power is preferably separately supplied to the first sputtering source and the second sputtering source respectively. According to this structure, power applied to the first sputtering source and that applied to the second sputtering source can be controlled independently of each other, whereby the composition of the active material layer consisting of the first and second materials can be readily controlled. When the power is separately applied, the frequency of a power source employed for the first sputtering source may be rendered different from the frequency of a power source employed for the second sputtering source. According to this structure, the two power sources can be prevented from interfering with each other. Thus, the two power sources can be readily controlled independently of each other. When the power is separately applied, a high-frequency power source may be employed for the first sputtering source, and either a DC power source or a pulse power source may be employed for the second sputtering source. According to this structure, the two power sources can be readily prevented from interfering with each other.

A method of forming an electrode for a lithium secondary cell according to a second aspect of the present invention, employed for forming an active material layer on the surface of a collector, comprises steps of arranging a first sputtering source for sputtering a first material forming the active material layer onto the surface of the collector and a second sputtering source for sputtering a second material forming the active material layer onto the surface of the collector so that plasma regions of the first sputtering source and the second sputtering source overlap with each other and sputtering the first material onto the surface of the collector by the first sputtering source while sputtering the second material onto the surface of the collector by the second sputtering source.

In the method of forming an electrode for a lithium secondary cell according to the second aspect, the first sputtering source and the second sputtering source so arranged that the plasma region thereof overlaps with that of the first sputtering source are employed for sputtering the first and second materials onto the surface of the collector as described above, whereby an active material layer constituted by at least two elements can be readily formed with excellent reproducibility. When power applied to the first sputtering source and that applied to the second sputtering source are controlled independently of each other in this case, the composition of the active material layer constituted by at least two elements can be readily controlled with excellent reproducibility.

In the aforementioned method of forming an electrode for a lithium secondary cell according to the second aspect, the step of sputtering the first material and the second material forming the active material layer preferably includes a step of sputtering the first material and the second material onto the surface of the collector from the first sputtering source and the second sputtering source while relatively moving the collector with respect to the first sputtering source and the second sputtering source. When the collector is relatively moved with respect to the first and second sputtering sources for sputtering the first and second materials onto the surface of the collector from the first and second sputtering sources, the composition ratio (concentration distribution) of the active material layer containing the first and second materials can be homogenized. Thus, the active material layer constituted by at least two elements can be readily formed in homogeneous composition.

In the aforementioned method of forming an electrode for a lithium secondary cell, the step of sputtering the materials forming the active material layer preferably includes a step of sputtering the first material and the second material onto the surface of the collector from the first sputtering source and the second sputtering source respectively while cooling the collector. When the first and second materials are sputtered onto the surface of the collector from the first and second sputtering sources while cooling the collector, the collector component can be prevented from excessively diffusing into the active material layer when the collector is at a high temperature. When the collector component properly diffuses into the active material layer, pulverization can be suppressed and the quantity of expansion/shrinkage of a thin film can be reduced, similarly to the aforementioned case of adding the foreign element to Si. Thus, stress applied from the thin film to the collector can be reduced in charging/discharging, thereby preventing separation of the thin film from the collector. When the collector component largely diffuses into the active material layer, however, the quantity of Si contributing to charging/discharging is reduced to lower the cell capacity. It is important to prevent excessive temperature increase, in order to prevent internal stress resulting from difference in expansion between the collector and a substrate and conversion from a solid solution to an intermetallic compound.

In the aforementioned method of forming an electrode for a lithium secondary cell, the step of sputtering the first material and the second material forming the active material layer preferably includes a step of separately supplying power to the first sputtering source and the second sputtering source respectively thereby controlling the composition of the active material layer consisting of the first material and the second material sputtered onto the surface of the collector. When the power is separately supplied to the first and second sputtering sources, the power applied to the first sputtering source and that applied to the second sputtering source can be controlled independently of each other, whereby the composition of the active material layer consisting of the first and second materials can be readily controlled. When the power is separately applied, the frequency of a power source employed for the first sputtering source may be rendered different from the frequency of a power source employed for the second sputtering source. According to this structure, the two power sources can be prevented from interfering with each other. Thus, the two power sources can be readily controlled independently of each other. When the power is separately applied, a high-frequency power source may be employed for the first sputtering source, and either a DC power source or a pulse power source may be employed for the second sputtering source. According to this structure, the two power sources can be readily prevented from interfering with each other.

The aforementioned method of forming an electrode for a lithium secondary cell according to the second aspect preferably further comprises a step of roughening the surface of the collector in advance of the sputtering step. According to this structure, adhesion between the active material layer and the collector can be improved.

In the aforementioned method of forming an electrode for a lithium secondary cell according to the second aspect, the first sputtering source preferably includes a first target consisting of the first material, and the first material forming the first target preferably contains at least Si. According to this structure, the active material layer can be readily formed by adding a foreign element to Si when employing a target of the foreign element as the second sputtering source. In this case, the first material forming the first target preferably contains at least one element selected from a group consisting of Cu, Co, Fe, Zn, Zr, Mn, Ni and Ag in addition to Si. When a target consisting of a material containing Si and a foreign element is employed as the first target of the first sputtering source and a target consisting of the same foreign element as the above is employed as the second sputtering source, the composition ratio between Si and the foreign element can be more readily controlled when forming the active material layer by adding the foreign element to Si.

In the aforementioned method of forming an electrode for a lithium secondary cell according to the second aspect, the second sputtering source preferably includes a second target consisting of the second material, and the second material forming the second target preferably contains a metallic element. When the second material of the second sputtering source contains the metallic element and the target containing Si is employed as the first sputtering source, the active material layer can be readily formed by adding the metallic element to Si. In this case, the metallic element preferably includes at least one element selected from a group consisting of Cu, Co, Fe, Zn, Zr, Mn, Ni and Ag. When such a metallic element is employed as the component of the second target of the second sputtering source and Si is employed as the first sputtering source, the active material layer can be readily formed by adding the aforementioned metallic element to Si. In this case, pulverization of Si can be effectively prevented by adding the aforementioned metallic element to Si.

In the aforementioned method of forming an electrode for a lithium secondary cell according to the second aspect, the first sputtering source preferably includes a first target consisting of the first material, the first material forming the first target is preferably Si, the second sputtering source preferably includes a second target consisting of the second material, and the second material forming the second target is preferably Co. According to this structure, the active material layer consisting of Si and Co can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example of the present invention is now specifically described.

EXAMPLE 1

Figure 1:
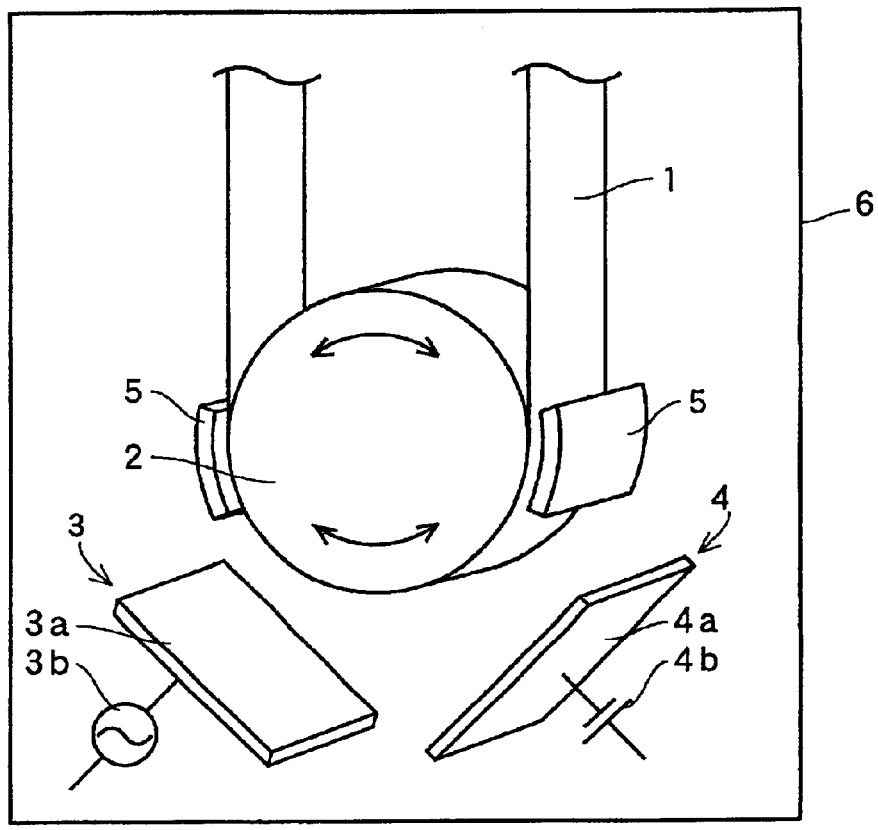
FIG. 1 is a perspective view showing an apparatus for forming a negative electrode according to Example 1 of the present invention.
Figure 2:
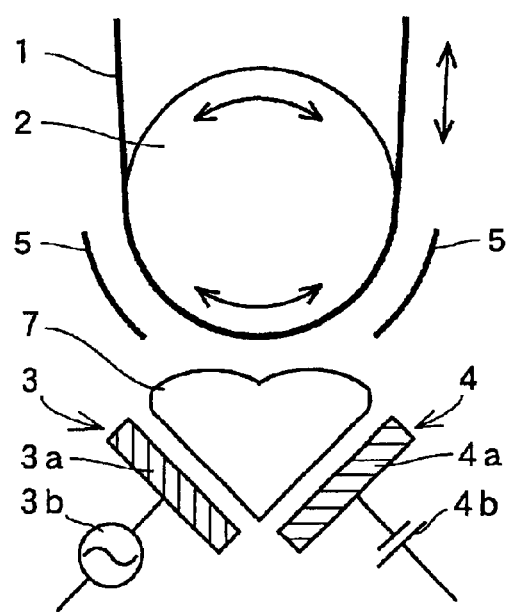
FIG. 2 is a schematic diagram for illustrating a method of forming a negative electrode according to Example 1 of the present invention.

FIG. 1 is a perspective view showing an apparatus for forming a negative electrode for a lithium secondary cell according to Example 1 of the present invention. FIG. 2 is a schematic diagram for illustrating a method of forming a negative electrode according to Example 1 of the present invention.

According to Example 1, a negative electrode active material prepared by adding Co to Si as a foreign element was deposited on a collector 1 consisting of copper foil by sputtering, thereby forming a negative electrode.

The structure of the apparatus for forming a negative electrode employed in Example 1 is described with reference to FIG. 1. This apparatus for forming a negative electrode was structured to comprise a vacuum chamber 6, a rotary holder 2, an Si sputtering source 3, a Co sputtering source 4 and anti-adhesion plates 5. The rotary holder 2 was formed to have a function of relatively movably holding the collector 1 with respect to the Si sputtering source 3 and the Co sputtering source 4 and a function of circulating water therein for cooling the collector 1 subjected to sputtering. The Si sputtering source 3 was formed to include an Si target 3a and an AC power source 3b, while the Co sputtering source 4 was formed to include a Co target 4a and a DC pulse power source 4B respectively.

The rotary holder 2 is an example of the "collector holding part" according to the present invention. The Si sputtering source 3 is an example of the "first sputtering source" according to the present invention, and the Co sputtering source 4 is an example of the "second sputtering source" according to the present invention. The Si target 3a is an example of the "first target" of the present invention, and the Co target 4a is an example of the "second target" of the present invention.

According to Example 1, the aforementioned apparatus for forming a negative electrode for a lithium secondary cell was employed for forming an active material layer consisting of Si and Co on the collector 1 under the following conditions: The surface of the collector 1 (about 26 $\mu$m in thickness) was roughened by electrolyzing rolled copper foil of 10 cm in width and 60 cm in length. This electrolysis is important for improving adhesion between the active material layer formed on the surface of the collector 1 in a later step and the collector 1.

This collector 1 was set on the rotary holder 2, which in turn was cooled and reciprocated at a speed of 5 cm/min. for simultaneously forming films of Si and Co on the collector 1 from the Si sputtering source 3 and the Co sputtering source 4. In this case, the Si target 3a and the Co target 4a were prepared from those of 10.2 cm (4 inches) by 30.5 cm (12 inches) by 5 mm (thickness). The Si target 3a and the Co target 4a were arranged around the rotary holder 2 of 200 mm in diameter to form an angle of 90° with each other. Thus, the Si target 3a and the Co target 4a had mutually overlapping plasma regions 7, as shown in FIG. 2. The anti-adhesion plates 5 were provided for preventing formation of Si and Co films in un-overlapping plasma regions on the collector 1. Si is an example of the "first material" according to the present invention, and Co is an example of the "second material" according to the present invention.

According to Example 1, the AC power source 3b having making power of 1.3 kW and a frequency of 13.56 MHz was connected to the Si target 3a while the DC pulse power source 4b having making power of 200 W and a pulse frequency of 100 kHz was connected to the Co target 4a thereby controlling power applied to the Si sputtering source 3 and that applied to the Co sputtering source 4 independently of each other.

The films of Si and Co were simultaneously formed under the aforementioned conditions, thereby depositing Si and Co on the surface of the collector 1 on the overlapping plasma regions 7 of the Si sputtering source 3 and the Co sputtering source 4 set to form the angle of about 90°. Thus, an active material layer consisting of a solid solution of Si and Co (Si—Co thin film) having a thickness of about 6 $\mu$m was formed on the surface of the collector 1.

The active material layer according to Example 1 formed in the aforementioned manner was a thin film mainly composed of amorphous Si having Co concentration of about 10% with neither in-plane concentration distribution nor concentration distribution along the thickness. In other words, it was possible to form an Si—Co thin film having homogeneous composition with no concentration distribution according to Example 1. When an active material layer was formed a plurality of times under experimental conditions similar to those of Example 1, an Si—Co thin film having a homogeneous composition ratio with Co concentration of about 10% was obtained similarly to Example 1.

As a result of X-ray diffraction analysis, no peak of an intermetallic compound was recognized in the obtained thin film but it was proved that Co formed the solid solution with Si.

According to Example 1, as hereinabove described, it was proved that an Si—Co thin film having a homogeneous composition ratio as a whole can be obtained with excellent reproducibility by providing the Si sputtering source 3 and the Co sputtering source 4 so that the plasma regions 7 overlap with each other and forming the films of Si and Co on the surface of the collector 1 while reciprocating the rotary holder 2. According to Example 1, Co can be added to Si in homogeneous concentration, whereby pulverization of Si can be effectively prevented.

According to Example 1, further, copper forming the collector 1 can be prevented from excessively diffusing into the active material layer when the collector 1 is at a high temperature by circulating water through the rotary holder 2 for cooling the collector 1 subjected to formation of the active material layer. Consequently, charge/discharge characteristics can be prevented from deterioration resulting from excessive diffusion of copper in the active material layer.

The power applied to the Si sputtering source 3 and the Co sputtering source 4 may be controlled in order to change the Co concentration of the active material layer to a value other than 10% in Example 1.

According to Example 1, Co can be added to Si in homogeneous concentration as described above, whereby pulverization of Si can be effectively prevented.

COMPARATIVE EXAMPLE 1

Figure 3:
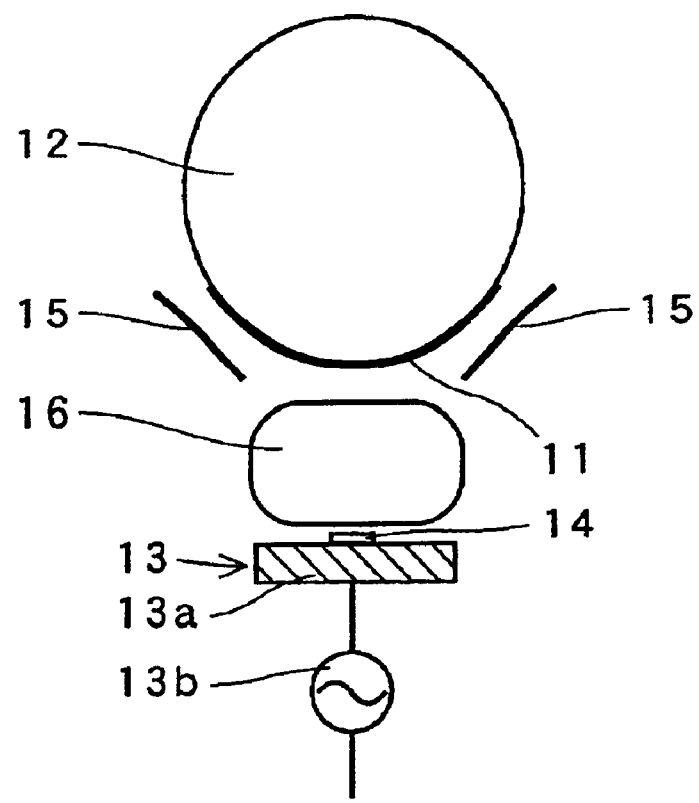
FIGS. 3 and 4 are schematic diagrams for illustrating a method of forming a negative electrode according to comparative example 1 of the present invention.
Figure 4:
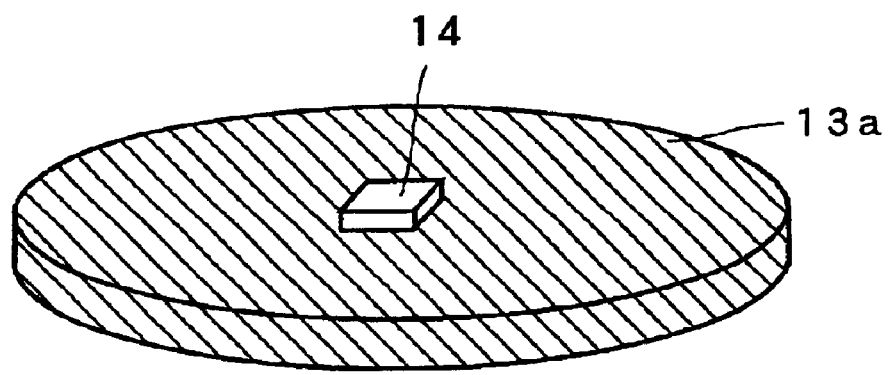

FIGS. 3 and 4 are schematic diagrams for illustrating a method of forming a negative electrode for a lithium secondary cell according to comparative example 1. Referring to FIGS. 3 and 4, a sputtering source 13 having a Co chip 14 placed on an Si target 13a was employed in comparative example 1 in place of the two sputtering sources, i.e., the Si sputtering source 3 and the Co sputtering source 4 employed in Example 1 shown in FIGS. 1 and 2, for forming an active material layer consisting of Si and Co on the surface of a collector 11 while fixing a rotary holder 12.

The structure of an apparatus for forming a negative electrode according to comparative example 1 is now described. According to comparative example 1, the Si sputtering source 13 was formed to include the Si target 13a of about 10.2 cm (4 inches) in diameter and an AC power source 13b having making power of 350 W and a frequency of 13.56 MHz and to have a plasma region 16, as shown in FIG. 3. Further, the Co chip 14 of 10 mm square having a thickness of 1 mm was arranged on the Si target 13a, as shown in FIGS. 3 and 4. Anti-adhesion plates 15 were so provided that an active material layer consisting of Si and Co was formed only on a prescribed region of the collector 11. The apparatus for forming a negative electrode according to comparative example 1 is similar to that according to Example 1 except the Si sputtering source 13.

The method of forming a negative electrode according to comparative example 1 employing the aforementioned apparatus is now described. The collector 11 was prepared from electrolyzed rolled copper foil of 10 cm square having a thickness of about 26 μm, similarly to Example 1.

This collector 11 was wound and set on the rotary holder 12, which in turn was cooled in a fixed (unmoved) state for simultaneously sputtering Si and Co onto the collector 11 from the Si sputtering source 13 and the Co chip 14 respectively. Thus, an active material layer consisting of an Si—Co thin film having a thickness of about 6 μm was formed on the surface of the collector 11.

The active material layer consisting of the Si—Co thin film according to comparative example 1 exhibited Co concentration of about 10% with neither in-plane concentration distribution nor concentration distribution along the thickness. When a similar experiment was repeated 10 times without adding, supplementing or exchanging the Co chip 14 employed for comparative example 1, however, the Co chip 14 was so consumed that the Co concentration in the active material layer was gradually reduced. The Co concentration of the active material layer formed at the $10^{th}$ time was about 8%. This active material layer exhibited in-plane concentration distribution of Co and concentration distribution along the thickness. In other words, the composition of the active material layer formed at the time was heterogeneous. Thus, it has been proved necessary to exchange the Co chip 14 every time the active material layer is formed in the method according to comparative example 1, in order to form the active material layer in homogeneous composition with no concentration distribution. Therefore, the method according to comparative example 1 is conceivably rather inferior in reproducibility and productivity.

COMPARATIVE EXAMPLE 2

Figure 5:
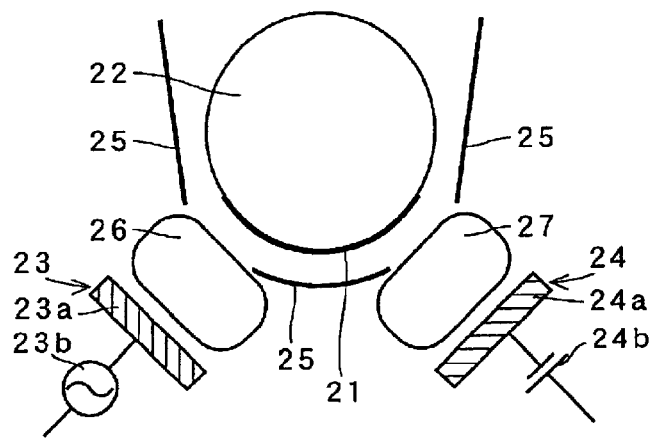
FIG. 5 is a schematic diagram for illustrating a method of forming a negative electrode according to comparative example 2 of the present invention.

FIG. 5 is a schematic diagram for illustrating a method of forming a negative electrode according to comparative example 2. Referring to FIG. 5, an Si sputtering source 23 and a Co sputtering source 24 were arranged not to overlap plasma regions 26 and 27 thereof with each other dissimilarly to Example 1 shown in FIGS. 1 and 2, for forming an active material layer consisting of Si and Co on the surface of a collector 21 while rotating a rotary holder 22.

An apparatus for forming a negative electrode according to comparative example 2 is now described. According to comparative example 2, the Si sputtering source 23 and the Co sputtering source 24 were arranged not to overlap the plasma regions 26 and 27 thereof with each other. Further, anti-adhesion plates 25 were arranged not to overlap film forming regions of the plasma regions 26 and 27 on the surface of the collector 21. The Si sputtering source 23 was formed to include an Si target 23a of 10.2 cm (4 inches) in diameter and an AC power source 23b having making power of 350 W and a frequency of 13.56 MHz, and the Co sputtering source 24 was formed to include a Co target 24a of 5.1 cm (2 inches) in diameter and a DC pulse power source 24b having making power of 200 W and a pulse frequency of 100 KHz. The structure of the apparatus for forming a negative electrode according to comparative example 2 is similar to that according to Example 1 except the Si sputtering source 23, the Co sputtering source 24 and the anti-adhesion plates 25.

The method of forming a negative electrode according to comparative example 2 employing the aforementioned apparatus is now described. The collector 21 was identical to the collector 11 according to comparative example 1.

The collector 21 was wound and set on the rotary holder 22, which in turn was cooled and rotated at a speed of 6 rpm for simultaneously sputtering Si and Co onto the collector 21 from the Si sputtering source 23 and the Co sputtering source 24. In this case, the plasma regions 26 and 27 of the Si sputtering source 23 and the Co sputtering source 24 did not overlap with each other, and hence a multilayer film of an Si film having a thickness of about 3 nm and a Co film having a thickness of about 0.4 nm was formed on the surface of the collector 21 by rotating the rotary holder 22 at the constant speed. An active material layer of about 6 μm in thickness was formed by stacking a plurality of such multilayer films of Si and Co.

The active material layer according to comparative example 2 consisting of the multilayer film of Si and Co exhibited Co concentration of about 10% with no in-plane concentration distribution. However, the active material layer exhibited concentration distribution along the thickness reflecting the composition of the Si film having the thickness of about 3 nm and the Co film having the thickness of about 0.4 nm.

Thus, it has been proved difficult to homogenize the composition ratio of the active material layer according to comparative example 2, formed by the multilayer film of Si and Co, along the thickness. When such a negative electrode formed with an active material layer having a heterogeneous composition ratio according to comparative example 2 is applied to a lithium secondary cell, it is conceivably difficult to obtain excellent cycle characteristics.

[Preparation of Electrodes a1, b1 and b2]

The active material layer consisting of the Si—Co thin film prepared in Example 1 was cut into 2 cm by 2 cm along with the collector consisting of copper foil, thereby preparing an electrode a1 according to Example 1. The Si—Co thin film prepared in comparative example 1 was similarly cut thereby preparing an electrode b1 according to comparative example 1. The multilayer film of Si and Co prepared in comparative example 2 was also similarly cut thereby preparing an electrode b2 according to comparative example 2.

[Measurement of Operating Cycle Characteristics]

The electrodes a1, b1 and b2 according to Example 1 and comparative examples 1 and 2 prepared in the aforementioned manner were employed as working electrodes for preparing test cells along with counter electrodes and reference electrodes of metal lithium. An electrolyte was prepared by dissolving 1 mol/l of $LiPF_6$ in a constant-volume mixed solvent of ethylene carbonate and diethyl carbonate. In a unipolar test cell, reduction and oxidation of the working electrode are regarded as charging and discharging respectively.

Each of the aforementioned test cells was charged at 25° C. with a constant current of 2 mA until the potential with reference to the reference electrode reached 0 V, and thereafter discharged to reach 2 V in each operating cycle, for measuring a capacity retention ratio in each of first to $10^{th}$ cycles. Table 1 and FIG. 6 show the results.

TABLE 1

| Number of Cycles | | 1 | 2 | 3 | 4 | 5 | 6 | 7 | 8 | 9 | 10 |
|---|---|---|---|---|---|---|---|---|---|---|---|
| Capacity retention ratio (%) | Electrode a1 | 100 | 100 | 102 | 102 | 102 | 102 | 102 | 100 | 98 | 99 |
| | Electrode b1 | 100 | 100 | 102 | 103 | 102 | 103 | 104 | 101 | 101 | 102 |
| | Electrode b2 | 100 | 99 | 96 | 94 | 93 | 92 | 92 | 91 | 90 | 89 |

Figure 6:
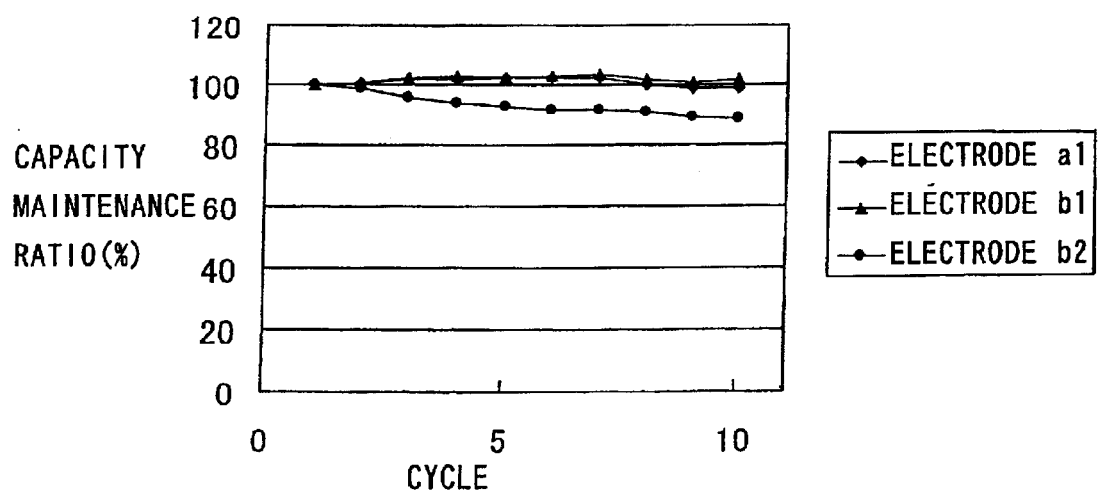
FIG. 6 is a graph showing operating cycle characteristics of test cells including active material layers prepared by the methods of forming negative electrodes according to Example 1 and comparative examples 1 and 2 of the present invention.

As shown in Table 1 and FIG. 6, the test cells employing the electrodes a1 and b1 according to Example 1 and comparative example 1 exhibit superior operating cycle performance to the test cell employing the electrode b2 according to comparative example 2. This proves that an electrode having superior operating cycle characteristics is obtained when forming a solid solution of Si and Co as in Example 1 or comparative example 1, as compared with the multilayer structure of Si and Co according to comparative example 2. The electrode b1 according to comparative example 1 exhibits excellent characteristics similarly to the electrode a1 according to Example 1. In the electrode b1 according to comparative example 1, however, reproducibility or Co concentration is deteriorated due to consumption of the Co chip 14, leading to inferior productivity to the electrode a1 according to Example 1.

Although the present invention has been described and illustrated in detail, it is clearly understood that the same is by way of illustration and example only and is not to be taken by way of limitation, the spirit and scope of the present invention being limited only by the terms of the appended claims.

For example, while Co has been employed as the foreign element added to Si in the aforementioned Example 1, the present invention is not restricted to this but another element such as Cu, Fe, Zn, Zr, Mn, Ni or Ag may alternatively be employed in place of Co. In this case, a target consisting of such a foreign element may be formed. Pulverization of Si can be prevented by adding any of these foreign elements to Si.

While the active material layer has been formed by employing the Si target 3a consisting of Si and the Co target 4a consisting of Co in the aforementioned Example 1, the present invention is not restricted to this but the first target may alternatively be formed to contain at least one foreign element selected from Cu, Co, Fe, Zn, Zr, Mn, Ni and Ag in addition to Si while the second target may alternatively be made of the same foreign element as that added to Si. In this case, the concentration of the foreign element contained in the active material layer can be readily increased when forming the active material layer by adding the foreign element to Si by employing the first target consisting of the material containing Si and the foreign element and the second target consisting of the foreign element. Thus, the composition ratio of Si and the foreign element can be more readily controlled. Similar control can be performed also when employing a target consisting of Si and another target consisting of a material containing Si and a foreign element, as a matter of course.

While the AC power source 3b having the power of 1.3 kW and the DC pulse power source 4b having the power of 200 W and the frequency of 100 kHz have been connected to the Si target 3a and the Co target 4a respectively in the aforementioned Example 1, the present invention is not restricted to this but an AC power source and a DC power source may alternatively be connected to the Si target 3a and the Co target 4a respectively. Further alternatively, AC power sources having frequencies different by at least several 10 Hz from each other may be connected to the Si target 3A and the Co target 4a respectively. According to this structure, the power sources for the Si target 3a and the Co target 4a do not interfere with each other, whereby the Si target 3a and the Co target 4a can readily be controlled independently of each other. Both power sources may be DC power sources or DC pulse power sources, as a matter of course. The composition ratio of the active material layer consisting of Si and Co can be readily controlled by adjusting the power applied to the Si target 3a and that applied to the Co target 4a respectively.

While the length of the collector 1 has been short (60 cm) in the aforementioned Example 1, the present invention is not restricted to this but the length of the collector 1 may alternatively be increased to several 100 m for continuously forming an Si—Co thin film on the collector 1 while moving the same. According to this structure, production efficiency can be improved.

While the rotary holder 2 has been cooled for cooling the collector 1 according to the aforementioned Example 1, the present invention is not restricted to this but the rotary holder 2 may alternatively be heated for properly controlling diffusion of each of Si and Co forming the active material layer and Cu forming the collector.

What is claimed is:

1. An apparatus for forming an electrode for a lithium secondary cell for forming an active material layer on the surface of a collector, comprising:

a first sputtering source for sputtering a first material forming said active material layer onto the surface of said collector;

a second sputtering source for sputtering a second material, different from the first material, forming said active material layer onto the surface of said collector, wherein a plasma region of said first sputtering source and a plasma region of said second sputtering source are arranged to overlap with each other; and a collector holding part capable of holding said collector and relatively moving said collector with respect to said first sputtering source and said second sputtering source.

2. The apparatus for forming an electrode for a lithium secondary cell according to claim 1, wherein
said collector holding part includes means cooling said collector.

3. The apparatus for forming an electrode for a lithium secondary cell according to claim 1, wherein
said collector holding part has a substantially cylindrical form, and
said first sputtering source and said second sputtering source are arranged to enclose said collector holding part.

4. The apparatus for forming an electrode for a lithium secondary cell according to claim 1, wherein
said second sputtering source includes a second target consisting of said second material, and
said second material forming said second target contains a metallic element.

5. The apparatus for forming an electrode for a lithium secondary cell according to claim 4, wherein
said metallic element includes at least one element selected from a group consisting of Cu, Co, Fe, Zn, Zr, Mn, Ni and Ag.

6. An apparatus for forming an electrode for a lithium secondary cell for forming an active material layer on the surface of a collector, comprising:
a first sputtering source for sputtering a first material forming said active material layer onto the surface of said collector;
a second sputtering source for sputtering a second material forming said active material layer onto the surface of said collector; wherein
a plasma region of said first sputtering source and a plasma region of said second sputtering source are arranged to overlap with each other, and
an anti-adhesion member set on a region other than the area of said plasma region of said first sputtering source and said plasma region of said second sputter region overlapping with each other.

7. An apparatus for forming an electrode for a lithium secondary cell for forming an active material layer on the surface of a collector, comprising:
a first sputtering source for sputtering a first material forming said active material layer onto the surface of said collector; and
a second sputtering source for sputtering a second material forming said active material layer onto the surface of said collector; wherein:
a plasma region of said first sputtering source and a plasma region of said second sputtering source are arranged to overlap with each other;
said first sputtering source includes a first target consisting of said first material; and
said first material forming said first target contains at least Si and at least one element selected from the group consisting of Cu, Co, Fe, Zn, Zr, Mn, Ni and Ag.

8. An apparatus for forming an electrode for a lithium secondary cell for forming an active material layer on the surface of a collector, comprising:

a first sputtering source for sputtering a first material forming said active material layer onto the surface of said collector; and
a second sputtering source for sputtering a second material forming said active material layer onto the surface of said collector; wherein:
a plasma region of said first sputtering source and a plasma region of said second sputtering source are arranged to overlap with each other;
said first sputtering source includes a first target consisting of said first material;
said first material forming said first target is Si;
said second sputtering source includes a second target consisting of said second material; and
said second material forming said second target is Co.

9. An apparatus for forming an electrode for a lithium secondary cell for forming an active material layer on the surface of a collector, comprising:
a first sputtering source for sputtering a first material forming said active material layer onto the surface of said collector; and
a second sputtering source for sputtering a second material forming said active material layer onto the surface of said collector; wherein:
a plasma region of said first sputtering source and a plasma region of said second sputtering source are arranged to overlap with each other; and
power is separately supplied to said first sputtering source and said second sputtering source respectively.

10. The apparatus for forming an electrode for a lithium secondary cell according to claim 9, wherein
the frequency of a power source employed for said first sputtering source is rendered different from the frequency of a power source employed for said second sputtering source when said power is separately applied.

11. The apparatus for forming an electrode for a lithium secondary cell according to claim 9, wherein
a high-frequency power source is employed for said first sputtering source and either a DC power source or a pulse power source is employed for said second sputtering source when said power is separately applied.

12. A method for forming an electrode for a lithium secondary cell for forming an active material layer on the surface of a collector, comprising steps of:
arranging a first sputtering source for sputtering a first material forming said active material layer onto the surface of said collector and a second sputtering source for sputtering a second material forming said active material layer onto the surface of said collector so that plasma regions of said first sputtering source and said second sputtering source overlap with each other; and
sputtering said first material onto the surface of said collector by said first sputtering source while sputtering said second material onto the surface of said collector by said second sputtering source.

13. The method of forming an electrode for a lithium secondary cell according to claim 12, wherein
said step of sputtering said first material and said second material forming said active material layer includes a step of sputtering said first material and said second material onto the surface of said collector from said first sputtering source and said second sputtering source while relatively moving said collector with respect to said first sputtering source and said second sputtering source.

14. The method of forming an electrode for a lithium secondary cell according to claim 12, wherein said step of sputtering said materials forming said active material layer includes a step of sputtering said first material and said second material onto the surface of said collector from said first sputtering source and said second sputtering source respectively while cooling said collector.

15. The method of forming an electrode for a lithium secondary cell according to claim 12, wherein said step of sputtering said first material and said second material forming said active material layer includes a step of separately supplying power to said first sputtering source and said second sputtering source respectively thereby controlling the composition of said active material layer consisting of said first material and said second material sputtered onto the surface of said collector.

16. The method of forming an electrode for a lithium secondary cell according to claim 15, wherein the frequency of a power source employed for said first sputtering source is rendered different from the frequency of a power source employed for said second sputtering source when said power is separately applied.

17. The method of forming an electrode for a lithium secondary cell according to claim 15, wherein a high-frequency power source is employed for said first sputtering source and either a DC power source or a pulse power source is employed for said second sputtering source when said power is separately applied.

18. The method of forming an electrode for a lithium secondary cell according to claim 12, further comprising a step of roughening the surface of said collector in advance of said sputtering step.

19. The method of forming an electrode for a lithium secondary cell according to claim 12, wherein said first sputtering source includes a first target consisting of said first material, and said first material forming said first target contains at least Si.

20. The method of forming an electrode for a lithium secondary cell according to claim 19, wherein said first material forming said first target contains at least one element selected from a group consisting of Cu, Co, Fe, Zn, Zr, Mn, Ni and Ag in addition to Si.

21. The method of forming an electrode for a lithium secondary cell according to claim 12, wherein said second sputtering source includes a second target consisting of said second material, and said second material forming said second target contains a metallic element.

22. The method of forming an electrode for a lithium secondary cell according to claim 21, wherein said metallic element includes at least one element selected from a group consisting of Cu, Co, Fe, Zn, Zr, Mn, Ni and Ag.

23. The method of forming an electrode for a lithium secondary cell according to claim 12, wherein said first sputtering source includes a first target consisting of said first material, said first material forming said first target is Si, said second sputtering source includes a second target consisting of said second material, and said second material forming said second target is Co.

* * * * *